US007574012B2

(12) United States Patent
Eggers et al.

(10) Patent No.: US 7,574,012 B2
(45) Date of Patent: Aug. 11, 2009

(54) HEARING AID WITH NOISE SUPPRESSION, AND OPERATING METHOD THEREFOR

(75) Inventors: Joachim Eggers, Erlangen (DE); Volkmar Hamacher, Neunkirchen am Brand (DE)

(73) Assignee: Siemens Audiologische Technik GmbH, Erlangen (DE)

( * ) Notice: Subject to any disclaimer, the term of this patent is extended or adjusted under 35 U.S.C. 154(b) by 871 days.

(21) Appl. No.: 11/009,568

(22) Filed: Dec. 10, 2004

(65) Prior Publication Data

US 2005/0147266 A1 Jul. 7, 2005

(30) Foreign Application Priority Data

Dec. 10, 2003 (DE) ................................ 103 57 800

(51) Int. Cl.
*H03B 29/00* (2006.01)

(52) U.S. Cl. ...................... 381/317; 381/71.1; 381/71.6

(58) Field of Classification Search ................ 381/71.1, 381/71.7, 312, 317
See application file for complete search history.

(56) References Cited

U.S. PATENT DOCUMENTS

| | | | | |
|---|---|---|---|---|
| 5,402,496 | A * | 3/1995 | Soli et al. | 381/94.2 |
| 6,741,707 | B2 * | 5/2004 | Ray et al. | 381/71.11 |
| 6,829,363 | B2 * | 12/2004 | Sacha | 381/315 |

FOREIGN PATENT DOCUMENTS

| | | |
|---|---|---|
| DE | 198 13 512 | 6/1999 |
| EP | 1 304 902 | 4/2003 |

* cited by examiner

*Primary Examiner*—Walter F Briney, III
(74) *Attorney, Agent, or Firm*—Schiff Hardin LLP

(57) ABSTRACT

Concurrent signal paths going pass a hearing aid bring about interferences in the auditory canal. These interferences are compensated by estimating an interfering signal from the input signal disturbed by interference from a microphone and applying to the interfering signal a transfer function, with which the concurrent acoustic signal path is simulated, thereby forming an interfering output signal, and combining a usable output signal from a signal-processing device with the interfering output signal. In this way, a noise suppression by directional microphone switching configurations can be made possible when concurrent signal paths do not make such directional microphone switching possible by conventional approaches.

8 Claims, 2 Drawing Sheets

HEARING AID WITH NOISE SUPPRESSION, AND OPERATING METHOD THEREFOR

BACKGROUND OF THE INVENTION

1. Field of the Invention

The present invention relates to a hearing aid of the type having an estimating device for estimating a usable signal from an input signal disturbed by interference and a signal-processing device for processing the usable signal to form a usable output signal. The present invention also relates to a method for suppressing noise at a hearing aid.

2. Description of the Prior Art

Persons with impaired hearing often have a reduced ability to communicate in noisy situations. To improve the signal-to-noise ratio, methods of noise reduction have been used for some time. For this purpose, in hearing aids the acoustic signal is picked up with the aid of one or more microphones and electrically processed in such a way that the signal-to-noise ratio is improved, and subsequently an interference-suppressed signal is output via an earphone in the auditory canal.

Depending on how the hearing aid is fitted, the acoustic signal may also enter the auditory canal directly, i.e. concurrently with an electrical processing path, and thus impair the desired influence of the electrical signal processing. Typical concurrent signal paths arise, for example, in the case of hearing aids with open supply or ear adapters with venting holes. In particular, it is known that such concurrent signal paths can strongly impair the noise suppression based on the directional microphone method in the low-frequency range to about 1 kHz.

A hearing aid of the above general type is known, for example, from German OS 198 13 512. Noise suppression occurs in this known device with the aforementioned impairment.

In addition, European Application 1 304 902 describes a method for interference elimination of a redundant acoustic signal in which the intensity of the interference is estimated and, dependent on the intensity of the interference, an input signal component is masked.

SUMMARY OF THE INVENTION

An object of the present invention is to provide a hearing aid with improved noise suppression. It is an object to provide an improved method of noise suppression for hearing aids.

According to the invention, this object is achieved by a hearing aid with an estimating device for estimating a usable signal from an input signal disturbed by interference and a first signal-processing device for processing the usable signal to form a usable output signal, and wherein the estimating device also estimates an interfering signal from the input signal disturbed by interference. Furthermore, the hearing aid has a second signal-processing device, with which it is possible to simulate the transfer function of an acoustic path, which is suitable for applying the transfer function to the interfering signal, thereby forming an interfering output signal. The hearing aid also has a combing device that combines the usable output signal with the interfering output signal.

Furthermore, the invention provides a method for suppressing noises at a hearing aid by estimating a usable signal from an input signal disturbed by interference and processing the usable signal to form a usable output signal, and also estimating an interfering signal from the input signal disturbed by interference, applying a transfer function with which an acoustic pith is simulated to the interfering signal, thereby forming an interfering output signal, and forming the usable output signal with the interfering output signal. The acoustic path will generally pass by the hearing aid in the auditory canal. This is a relatively short distance, so that it is important to generate a compensating signal from the estimated interfering signal as quickly as possible with the second signal-processing device. In this way it is possible to compensate as much as possible for the sound interference getting past the hearing aid to the eardrum.

The simulated transfer function may be linear. This reduces the computing time and consequently optimizes the interfering signal compensation. Alternatively, however, the transfer function may be time-variant, so that, for example, shifting of the hearing aid in the auditory canal can be taken into account.

Furthermore, the hearing aid may have an acoustic sensor, which, in the state of the hearing aid in which it is inserted in an auditory canal, can be placed or is placed at the end of the hearing aid facing the eardrum, so that its signal can be used for dynamic variation of the simulated transfer function of the second signal-processing device. In this way it is possible to take into account the acoustic state ahead of the eardrum to adapt the transfer function with a control loop.

The hearing aid may also have a coupling device, with which the usable output signal of the first signal-processing device can be coupled to the second signal-processing device for the variation of the simulated transfer function. In a further embodiment, the coupling factor of the coupling device during operation of the hearing aid can be set or varied. It is advantageous or the interfering signal to be strongly correlated with the usable signal, so that excessive damping of the usable signal can be prevented.

DESCRIPTION OF THE PREFERRED EMBODIMENTS

The exemplary embodiments described below represent preferred embodiments of the present invention.

Figure 1:
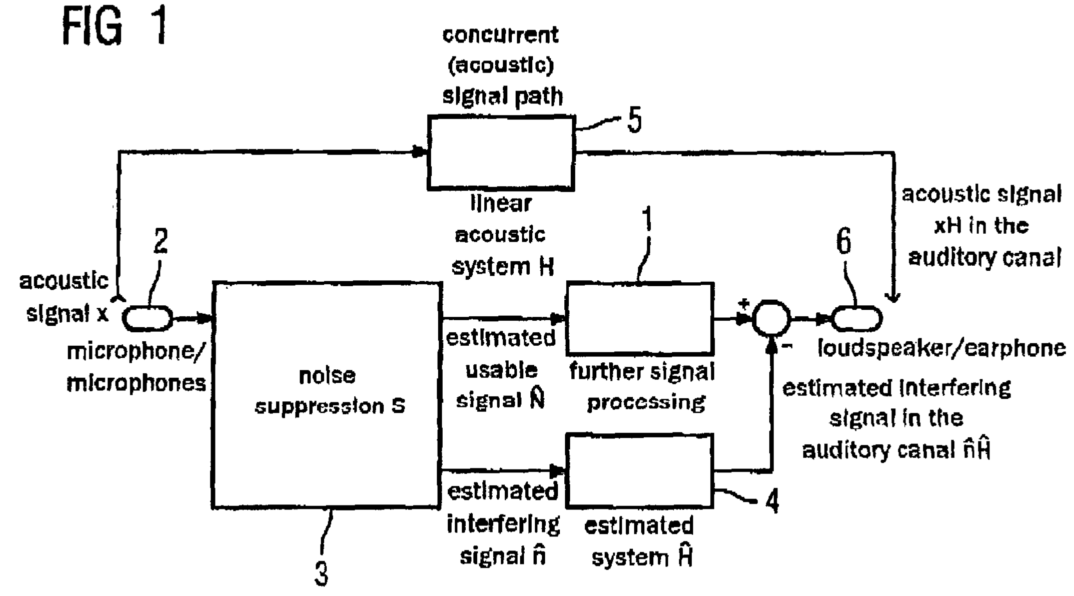
FIG. 1 is a block diagram of a hearing aid according to the invention with infeed of an estimated interfering signal in phase opposition according to a first embodiment.

The hearing aid schematically represented in FIG. 1 has as a central module a signal-processing device 1. This performs the further signal processing of a usable signal picked up by the microphone or the microphones 2 and freed of noise by the noise suppression device 3. In the noise suppression device 3, a usable signal $\hat{N}$ and an interfering signal $\hat{n}$ are estimated from the input signal from the microphone 2 or from the number of microphones. While the estimated usable signal $\hat{N}$ is further processed in the signal-processing device 1, an estimated system transfer function $\hat{H}$ is applied to the estimated interfering signal $\hat{n}$.

The transfer function $\hat{H}$ is obtained from a concurrent, acoustic signal path, which can be represented by a linear acoustic system 5 with a transfer function H. The input variable of the concurrent signal path is the same acoustic signal x that is also picked up by the microphone 2. At the end of the concurrent signal path, i.e. in the auditory canal, the acoustic signal xH is obtained on account of the multiplication by the transfer function H of the linear acoustic system 5. That the concurrent signal path is a linear acoustic system is undoubtedly a simplifying assumption, which has the purpose of making the signal-processing device 4 that is used for estimating or simulating the concurrent signal path as simple as possible.

The output signal $\hat{n}\,\hat{H}$ of the signal-processing device 4 with the transfer function $\hat{H}$ represents an estimate of the interfering signal xH that passes via the concurrent signal path into the auditory canal. This signal $\hat{n}\,\hat{H}$ is subtracted from the output signal of the signal-processing device 1 and thereby fed in phase opposition into the auditory canal through the earphone or speaker 6 of the hearing aid. In this way, the interfering signal xH and the anti-phase, estimated interfering signal $\hat{n}\,\hat{H}$ are cancelled out in the auditory canal and the concurrent signal path is compensated, to the extent to which this is allowed by the difference in transit time between the acoustic signal path and the electrical signal path.

Figure 2:
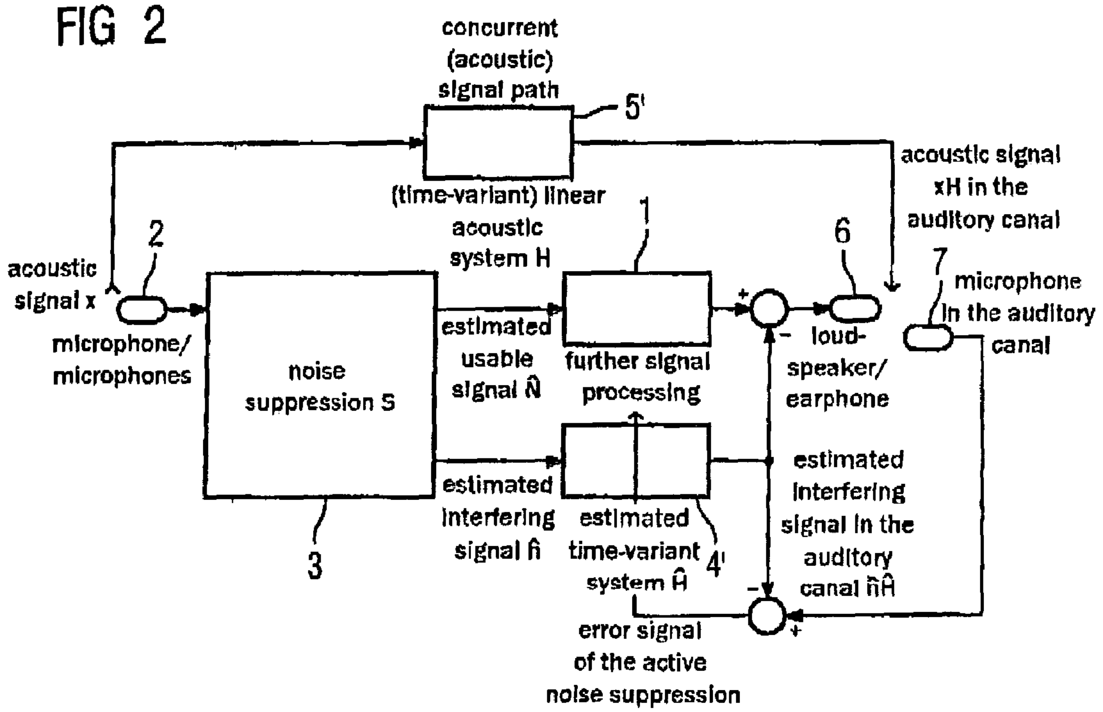
FIG. 2 is a block diagram of a hearing aid with additional microphone feedback according to a second embodiment.

The hearing aid of a second embodiment of the present invention is schematically reproduced in FIG. 2. By contrast with the first embodiment of FIG. 1, it is taken into account in the second embodiment that the linear acoustic system 5' of the concurrent acoustic signal path is time-variant, or at least not known sufficiently well during the design of the hearing aid. Therefore, the transfer function $\hat{H}$ of the signal-processing device 4' is likewise made time-variant. For the variation of the transfer function $\hat{H}$, a microphone 7 or other sensor is used, and is to be introduced into the auditory canal. The signal obtained by the microphone is subtracted from the estimated signal $\hat{n}\,\hat{H}$ in order to obtain an error signal for the adaptive setting of the system 4' with the transfer function $\hat{H}$. The adaptive setting of the transfer function $\hat{H}$ may take place for example with an (N)LMS (Normalized Least Mean Square) algorithm, as long as the estimated interfering signal $\hat{n}$ is sufficiently uncorrelated with the usable signal at the hearing aid output.

Figure 3:
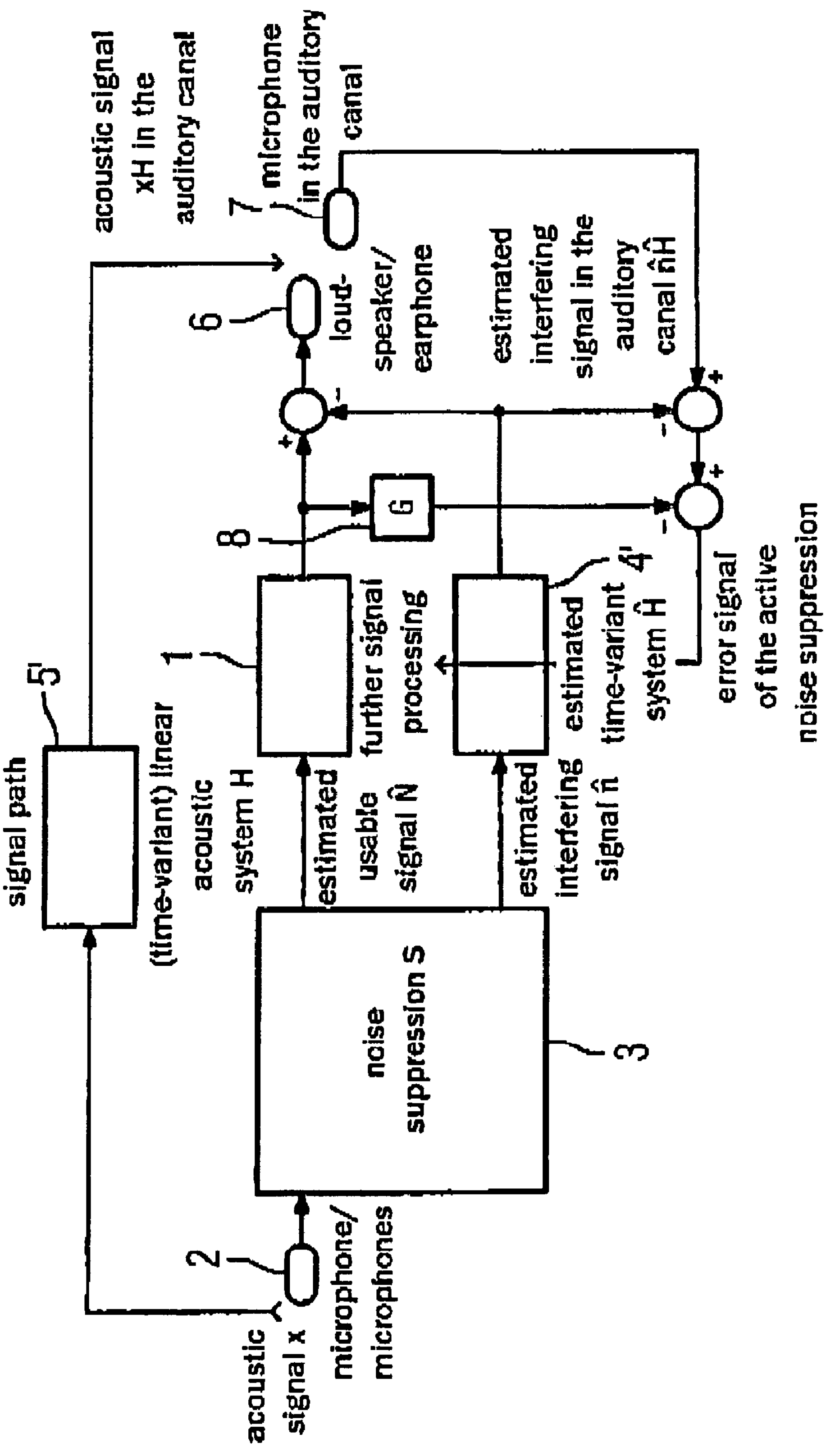
FIG. 3 is a block diagram of a hearing aid with variation of the interfering signal transfer dependent on the usable signal according to a third embodiment.

If, however, the estimated interfering signal $\hat{n}$ correlates to a certain extent with the usable signal at the hearing aid output, the influence of the usable signal on the adaptation of the filter or the signal-processing device 4' can be reduced by the transfer function $\hat{H}$, in that the usable signal is filtered by the coupling function G with a suitably chosen system 8. Such a system is represented in FIG. 3 in a third exemplary embodiment. In addition to the system from FIG. 2, the output signal of the signal-processing device 1 is therefore picked off by the coupling device 8 and multiplied by the coupling function G. The resultant signal is subtracted from the microphone signal of the microphone 7 in the auditory canal and the estimated interfering signal $\hat{n}\,\hat{H}$ already subtracted from it, so that an error signal of the active noise suppression is obtained. This error signal is used for the variation of the transfer function $\hat{H}$ in the time-variant signal-processing device 4'. It is possible in this way to prevent a usable signal that enters the auditory canal via the concurrent acoustic signal path, and would be interpreted there as an interfering signal, from being damped or suppressed.

The other components that are not mentioned in connection with the description of FIG. 2 and FIG. 3 but are represented there correspond to those of FIG. 1, so that reference is made to the relevant description.

In summary, it can consequently be stated that the signal $\hat{n}\,\hat{H}$ fed into the auditory canal in phase opposition compensates for the interfering signal components xH of the acoustic signal x in the auditory canal. In particular, the noise suppression by directional microphone switching configurations can also be made possible when concurrent signal paths do not make it possible by conventional approaches.

Although modifications and changes may be suggested by those skilled in the art, it is the intention of the inventors to embody within the patent warranted hereon all changes and modifications as reasonably and properly come within the scope of their contribution to the art.

We claim as our invention:

1. A hearing aid comprising:

an estimating device, supplied with an input signal disturbed by interference, that estimates a usable signal from said input signal and that estimates an interfering signal, representing said interference, from said input signal;

a first signal-processing device, supplied only with said usable signal, that processes said usable signal to form a usable output signal therefrom;

a second signal-processing device, supplied with said interfering signal, said second signal-processing device simulating a transfer function of an acoustic path of said interference, and applying the simulated transfer function to said interfering signal to form an interfering output signal;

a combining device that combines said usable output signal and said interfering output signal;

a coupling device coupling said usable signal output to said second signal-processing device, said second signal-processing device varying said simulated transfer function dependent on said usable output signal coupled thereto by said coupling device; and said coupling device has a selectively settable transfer factor that sets a degree of coupling of said usable output signal to said second signal-processing device.

2. A hearing as claimed in claim 1 wherein said hearing aid is configured to be worn in an auditory canal, and wherein said second signal-processing device simulates said transfer function for an acoustic passing by said hearing aid in the auditory canal.

3. A hearing as claimed in claim 1 wherein said second signal-processing device simulates said transfer function as a linear transfer function.

4. A hearing as claimed in claim 1 wherein said second signal-processing circuit simulates said transfer function as a time-varying transfer function.

5. A hearing as claimed in claim 1 wherein said hearing aid is configured to be worn in an auditory canal, spaced from an eardrum, and further comprising an acoustic sensor adapted to face the eardrum, said acoustic sensor generating a sensor signal and supplying said sensor signal to said second signal-processing circuit and said second signal-processing circuit dynamically varying said simulated transfer function dependent on said sensor signal.

6. A method for operating a hearing aid to suppress noises at an acoustic output of said hearing aid, comprising the steps of:

from an input signal disturbed by interference, electronically estimating a usable signal and electronically estimating an interference signal representing said interference;

electronically processing only said usable signal to form a usable output signal therefrom;

electronically determining a transfer function simulating an acoustic path traversed by said interference, and electronically applying said transfer function only to said interfering signal to form an interfering output signal;

electronically combining said usable output signal and said interfering output signal; and setting a coupling factor that determines a degree to which said simulated transfer function is varied dependent on said usable output signal.

7. A method as claimed in claim 6 comprising placing said hearing aid in an auditory canal next to an eardrum, and picking up an acoustic signal between said hearing aid and the eardrum in the auditory canal, and electronically dynamically varying said simulated transfer function dependent on said acoustic signal.

8. A method as claimed in claim 6 comprising electronically varying said simulated transfer function dependent on said usable output signal.

* * * * *